United States Patent
Hayashi et al.

(10) Patent No.: US 10,847,317 B2
(45) Date of Patent: Nov. 24, 2020

(54) ELECTRONIC COMPONENT

(71) Applicant: Murata Manufacturing Co., Ltd., Nagaokakyo (JP)

(72) Inventors: Yasunobu Hayashi, Nagaokakyo (JP); Nobuhiro Ishida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/296,583

(22) Filed: Mar. 8, 2019

(65) Prior Publication Data

US 2019/0206627 A1    Jul. 4, 2019

Related U.S. Application Data

(63) Continuation of application No. PCT/JP2017/039170, filed on Oct. 30, 2017.

(30) Foreign Application Priority Data

Nov. 8, 2016  (JP) .................. 2016-218406

(51) Int. Cl.
*H05K 1/18* (2006.01)
*H05K 1/16* (2006.01)
(Continued)

(52) U.S. Cl.
CPC .............. *H01G 4/248* (2013.01); *H01G 4/005* (2013.01); *H01G 4/06* (2013.01); *H01G 4/12* (2013.01);
(Continued)

(58) Field of Classification Search
CPC .......... H01G 4/248; H01G 4/005; H01G 4/06; H01G 4/12; H01G 4/33; H05K 1/181; H05K 2201/10015
See application file for complete search history.

(56) References Cited

U.S. PATENT DOCUMENTS 6,649,958 B2 * 11/2003 Fujisawa ............. H01L 27/0811
                                                      257/296
9,466,736 B2    10/2016 Yamamoto
(Continued)

FOREIGN PATENT DOCUMENTS

JP       H0547586 A      2/1993
JP       H10335122 A    12/1998
(Continued)

OTHER PUBLICATIONS

International Search Report issued in PCT/JP2017/039170, dated Jan. 23, 2018.
(Continued)

*Primary Examiner* — Ishwarbhai B Patel
(74) *Attorney, Agent, or Firm* — Arent Fox LLP (57) ABSTRACT

An electronic component that includes a substrate having a first main surface and a second main surface, an element on the first main surface of the substrate, a first contact electrode electrically connected to the element, an insulating film defining a first opening at a position that has an overlap with the first contact electrode in the plan view of the first main surface, a protective film covering the insulating film in a region including at least a part of the periphery of the first opening, and a first external electrode electrically connected to the first contact electrode and extending over the protective film.

20 Claims, 7 Drawing Sheets

(51) Int. Cl.
  *H05K 1/11*    (2006.01)
  *H01G 4/00*    (2006.01)
  *H01G 4/248*   (2006.01)
  *H01G 4/06*    (2006.01)
  *H01G 4/005*   (2006.01)
  *H01G 4/33*    (2006.01)
  *H01G 4/12*    (2006.01)
  *H05K 3/34*    (2006.01)

(52) U.S. Cl.
  CPC ............... *H01G 4/33* (2013.01); *H05K 1/162* (2013.01); *H05K 1/181* (2013.01); *H05K 3/3431* (2013.01); *H05K 1/11* (2013.01); *H05K 2201/10015* (2013.01)

(56) References Cited

U.S. PATENT DOCUMENTS

| | | | | |
|---|---|---|---|---|
| 2004/0130849 | A1* | 7/2004 | Kurihara | H01G 4/228 361/311 |
| 2005/0072998 | A1* | 4/2005 | Miura | H01L 27/11502 257/295 |
| 2006/0214205 | A1* | 9/2006 | Baniecki | H01G 4/005 257/295 |
| 2008/0224195 | A1* | 9/2008 | Wang | H01L 27/11507 257/295 |
| 2015/0280016 | A1* | 10/2015 | Yamamoto | H01L 29/94 257/532 |
| 2016/0372461 | A1 | 12/2016 | Yamamoto | |
| 2018/0040610 | A1 | 2/2018 | Yamamoto | |

FOREIGN PATENT DOCUMENTS

| | | |
|---|---|---|
| JP | 2003338401 A | 11/2003 |
| JP | 2005217443 A | 8/2005 |
| JP | 2011192742 A | 9/2011 |
| JP | 2013070108 A | 4/2013 |
| JP | 2015195337 A | 11/2015 |

OTHER PUBLICATIONS

Written Opinion of the International Searching Authority issued in PCT/JP2017/039170, dated Jan. 23, 2018.

* cited by examiner

ELECTRONIC COMPONENT

CROSS REFERENCE TO RELATED APPLICATIONS

The present application is a continuation of International application No. PCT/JP2017/039170, filed Oct. 30, 2017 which claims priority to Japanese Patent Application No. 2016-218406, filed Nov. 8, 2016, the entire contents of each of which are incorporated herein by reference.

FIELD OF THE INVENTION

The present invention relates to an electronic component.

BACKGROUND OF THE INVENTION

Conventional capacitor components include the capacitor component disclosed in Japanese Patent Application Laid-Open No. 5-47586 (Patent Document 1). The conventional capacitor component is provided with an insulating layer and two electrode terminals provided thereon, and mounted on a circuit board with the use of solder.

Patent Document 1: Japanese Patent Application Laid-Open No. 5-47586

SUMMARY OF THE INVENTION

The conventional capacitor component mentioned above has the problem of causing the insulating layer and the electrode terminals to be cracked, for example, when stress is applied when the substrate bends.

The present invention has been achieved in view of such circumstances, and an object of the present invention is to provide an electronic component which generates fewer cracks.

An electronic component according to one aspect of the present invention includes a substrate having a first main surface and a second main surface, an element on the first main surface of the substrate, a first contact electrode electrically connected to the element, an insulating film defining a first opening at a position that has an overlap with the first contact electrode in the plan view of the first main surface, a protective film covering the insulating film in a region including at least a part of the periphery of the first opening, and a first external electrode electrically connected to the first contact electrode and extending over the protective film.

According to the present invention, it is possible to provide an electronic component which generates fewer cracks.

DETAILED DESCRIPTION OF PREFERRED EMBODIMENTS OF THE INVENTION

Figure 1:
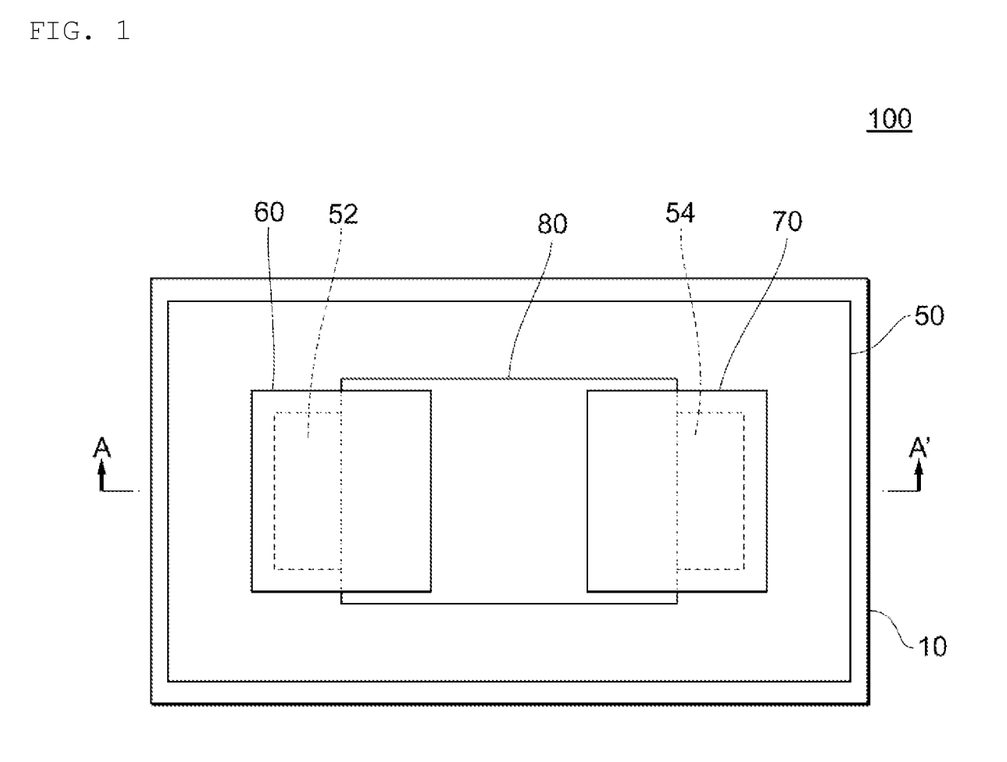
FIG. 1 is a diagram illustrating a first embodiment of a capacitor 100.
Figure 2:
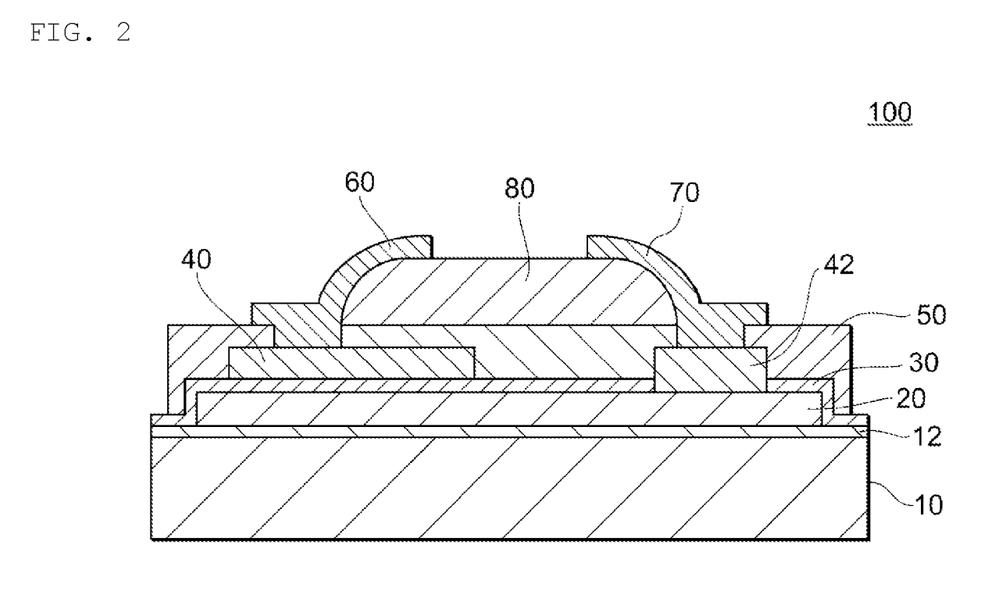
FIG. 2 is a diagram illustrating the first embodiment of the capacitor 100.

FIG. 1 is a plan view schematically illustrating the structure of a capacitor 100 according to a first embodiment of the present invention. In addition, FIG. 2 is a diagram illustrating a cross section taken along line AA' of FIG. 1. It is to be noted that FIGS. 1 and 2 illustrate an exemplary configuration for at least partially explaining features of the structure of the capacitor 100, but the capacitor 100 is not to be limited by the exact structure shown in the figures.

The capacitor 100 (which is an example of an electronic component) is configured to include a substrate 10, an insulating film 12, a lower electrode 20, a dielectric film 30, and an upper electrode 40. According to the present embodiment, the lower electrode 20, the dielectric film 30, and the upper electrode 40 constitute a capacitive element (which is an example of an element). In addition, the capacitor 100 includes a via electrode 42 (which is an example of a contact electrode) electrically connected to the lower electrode 20, a terminal electrode 70 electrically connected to the via electrode 42, and a terminal electrode 60 electrically connected to the upper electrode 40, and a protective film 80. It is to be noted that according to the present embodiment, the upper electrode 40 constituting the capacitive element can also serve as an example of the contact electrode. It is to be noted that the element according to the present invention is not limited to a capacitor, and may be a resistor, a coil, or a diode.

The substrate 10 has a surface (which is an example of a first main surface), which is a surface on the side provided with the lower electrode 20, and a rear surface (which is an example of a second main surface) on the side opposite to the surface of the substrate 10. The substrate 10 has a rectangular shape in the plan view of the surface of the substrate 10 (that is, the plan view of the substrate 10 viewed in the direction from the lower electrode 20 toward the substrate 10 (FIG. 1), which is hereinafter also referred to simply as a "plan view"). The substrate 10 is, for example, a semiconductor substrate such as silicon. The length of the long side of the substrate 10 is, for example, 200 μm to 600 μm, and the length of the short side thereof is 100 μm to 300 μm.

The insulating film 12 is formed from, for example, silicon oxide. Further, the insulating film 12 is formed from a material which makes close contact with the substrate 10 formed under the insulating film 12 and the lower electrode 20 formed on the insulating film 12. The insulating film 12 may be a film composed of multiple layers formed from different materials. The insulating film 12 has only to electrically insulate the substrate 10 from the lower electrode 20, and has a film thickness of, for example, approximately 0.5 µm to 3 µm. Further, the substrate 10 may be formed from, for example, an insulating material such as alumina. In this case, there is no need to form the insulating film 12 on the substrate 10.

The lower electrode 20 is formed in a region inside the peripheral edge of the substrate 10 in the plan view in the upper layer of the substrate 10. The shape of the lower electrode 20 in the plan view will be described later. The film thickness of the lower electrode 20 may be 0.3 µm to 10 µm, or may be 0.5 µm to 5 µm. As just described, the lower electrode 20 has a relatively large film thickness, thereby making it possible to lower the series resistance.

The lower electrode 20 is, for example, a metal made of copper, silver, gold, aluminum, nickel, chromium, titanium or the like, or a conductor containing the foregoing metal. In addition, the lower electrode 20 may be formed to have multiple layers formed from different materials.

The dielectric film 30 is formed so as to cover the surface of the lower electrode 20. Specifically, the dielectric film 30 is formed to cover the upper surface of the lower electrode 20 (that is, the surface opposed to the upper electrode 40) and the end surface, and at the position where the via electrode 42 is formed, the dielectric film 30 has an opening where the lower electrode 20 is exposed. The dielectric film 30 is formed from a dielectric or insulating material such as an oxide or a nitride, e.g., silicon oxide, silicon nitride, aluminum oxide, hafnium oxide, tantalum oxide, zirconium oxide. Further, the dielectric film 30 may be a multi-layer film composed of different dielectric materials. The dielectric film 30 is, for example, 0.02 µm to 2 µm in film thickness.

The upper electrode 40 is located on the dielectric film 30 inside the lower electrode 20 in the plan view. More specifically, the upper electrode 40 is located on the dielectric film 30 so as to all have an overlap with at least a part of the lower electrode 20 in the plan view of the surface of the substrate 10. The shape of the lower electrode 20 in the plan view will be described later. The film thickness of the upper electrode 40 may be, for example, 0.3 µm to 10 µm, and may be 0.5 µm to 5 µm. As just described, the upper electrode 40 has a relatively large film thickness, thereby making it possible to lower the series resistance.

The via electrode 42 is an electrode electrically connected to the lower electrode 20. The via electrode 42 is located on the upper surface of the lower electrode 20 in a region other than the partial region where the upper electrode 40 is formed, in the plan view. Further, the via electrode 42 is formed so as to fill the opening formed in the dielectric film 30. More specifically, the via electrode 42 is formed so as to make contact with the lower electrode 20 inside the opening. Further, the via electrode 42 may be formed from the inside of the opening over the dielectric film 30 around the opening.

According to the present embodiment, the upper electrode 40 and the via electrode 42 are formed from the same material. The upper electrode 40 and the via electrode 42 are, for example, a metal made of copper, silver, gold, aluminum, nickel, chromium, titanium or the like, or a conductor containing the metal.

The insulating film 50 is formed so as to cover the upper electrode 40 and the via electrode 42. In addition, the insulating film 50 has openings where the upper electrode 40 and the via electrode 42 are exposed respectively at the positions where the terminal electrodes 60 and 70 are formed. In addition, the insulating film 50 is, in the plan view, in the region outside the lower electrode 20, formed so as to cover the dielectric film 30 and the insulating film 12, and formed in the region inside the periphery of the substrate 10. The insulating film 50 is formed from, for example, an insulating material such as a polyimide resin or a silicon oxide. In addition, the insulating film 50 is, for example, 1 µm to 20 µm in film thickness.

The terminal electrode 60 formed on the upper electrode 40 and the insulating film 50, serves as a terminal for electrically connecting the upper electrode 40 and the outside. According to the present embodiment, the terminal electrode 60 is formed so as to be directly connected to the upper electrode 40, but another conductive film may be formed between the terminal electrode 60 and the upper electrode.

The terminal electrode 70 formed on the insulating film 50 and the via electrode 42, serves as a terminal for electrically connecting the lower electrode 20 and the outside. The terminal electrode 60 and the terminal electrode 70 may be made of materials that are more suitable for solder joints, for example, have better solderability than the materials of the lower electrode 20 and the upper electrode 40, and may be made of, for example, metals made of copper, nickel, silver, or the like. These materials make it possible to lower the resistance. In addition, the terminal electrode 70 may further have, on the surface thereof, a metallic film such as gold, palladium, tin, or a solder. The terminal electrode 60 and the terminal electrode 70 may have surfaces subjected to rust-proofing. In addition, the terminal electrode 60 and the terminal electrode 70 are, for example, 1 µm to 10 µm in film thickness.

The protective film 80 is provided so as to cover a part of the insulating film 50 in the plan view. According to the present embodiment, the insulating film 50 is provided with openings 52 and 54 (which are an example of a first opening and a second opening) which each have a rectangular shape, and the protective film 80 is provided so as to cover the region of the insulating film 50 between the opening 52 and the opening 54. More specifically, the protective film 80 is provided around the opening 52 so as to cover at least a region in the vicinity of the side opposed to the opening 54 among the four sides constituting the opening 52. Likewise, the protective film 80 is provided around the opening 54 so as to cover at least a region in the vicinity of the side opposed to the opening 52 among the four sides constituting the opening 54.

The protective film 80 is formed so as to protrude from the insulating film 50 in the thickness direction in the AA' cross section in FIG. 1. Further, the terminal electrode 60 is formed from the upper electrode 40 to the protective film 80, and the terminal electrode 70 is formed from the via electrode 42 to the protective film 80. In addition, the protective film 80 is formed so as to have an arcuate cross section at least in a part of the region where the terminal electrodes 60 and 70 are formed. In addition, the protective film 80 has an opposed surface opposed to the surface in contact with the insulating film 50, and one-side ends of the terminal electrodes 60 and 70 is preferably formed over positions including the opposed surface. For example, the opposed surface is a surface substantially parallel to the surface of the protective film 80 in contact with the insulating film 50. Therefore, for example, when stress is generated such that the terminal electrodes 60 and 70 rotate around the contacts with the upper electrode 40 and the via electrode 42, stress that causes one-side ends of the terminal electrodes 60 and 70 to rotate is absorbed by the protective film 80, thus making it possible to enhance the resistance to stress. It is to be noted that the cross section of the protective film 80 is not limited to the arcuate shape, but may be a rectangular shape or a triangular shape.

The protective film 80 is formed from a resin material such as polyimide, benzocyclobutene, polybenzoxazole, or an organic passivation material. In addition, the protective film 80 is formed to be thicker than the insulating film 50. The thickness of the protective film 80 is, for example, 20 μm or more. In addition, the protective film 80 is formed from a material that is lower in elastic modulus or Young's modulus than the insulating film 50. The elastic modulus is, for example, less than 10 gigapascals.

Figure 3:
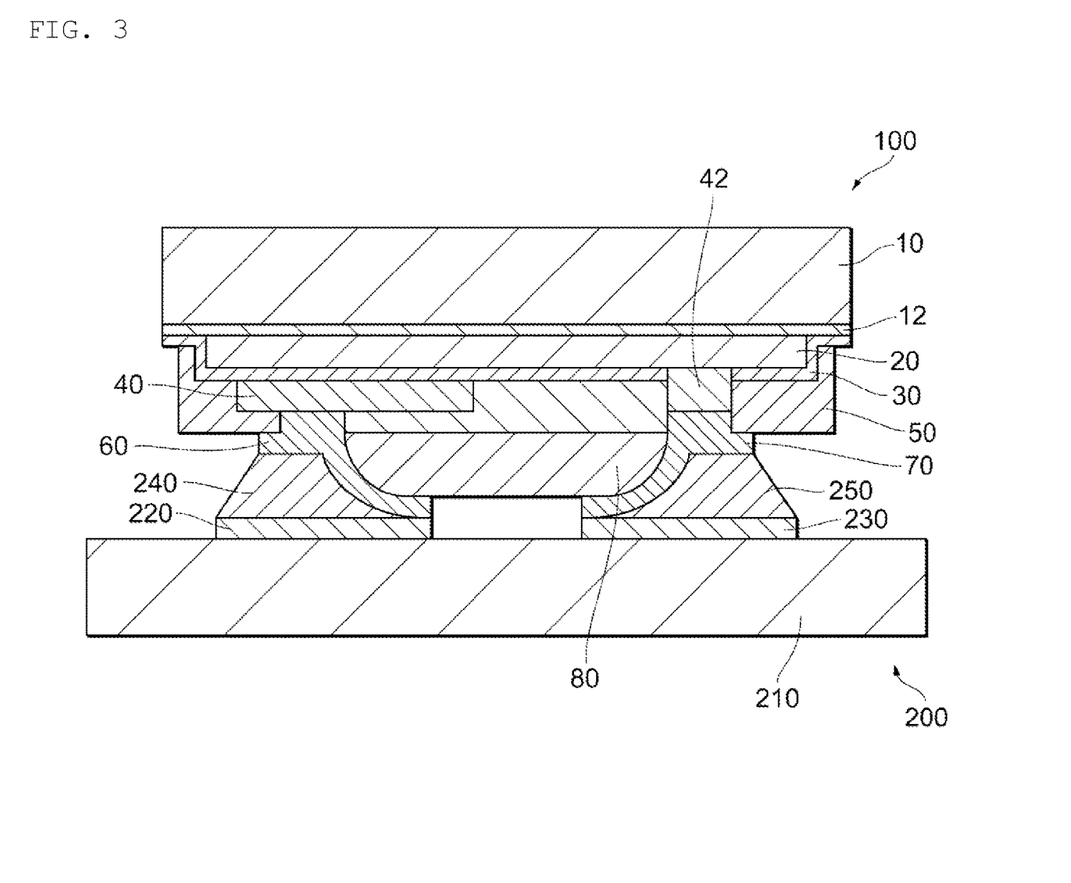
FIG. 3 is a diagram illustrating the capacitor 100 mounted on a circuit board 200.

FIG. 3 shows a cross section along the line AA' of FIG. 1, where the capacitor 100 according to the present embodiment is mounted on a circuit board 200. In FIG. 3, the capacitor 100 is mounted on the circuit board 200 with solders 240 and 250. Specifically, the terminal electrodes 60 and 70 are respectively joined to wirings 220 and 240 of the circuit board 200 with the solders 240 and 250, and thus, the capacitor 100 is mounted on the circuit board 200.

According to the present embodiment, the capacitor 100 has the protective film 80, thus making it possible to disperse the stress applied to the capacitor 100 in the thickness direction. As a result, it is possible to reduce the stress applied to the capacitive element and the substrate 10. Further, the protective film 80 has a sufficient thickness, and thus, even if relatively high stress is applied to the capacitor 100, cracks generated in the capacitor 100 can be stopped at the protective film 80, and kept from reaching the capacitive element or the substrate 10.

Further, according to the present embodiment, the capacitor 100 has the protective film 80, thereby making it possible to increase the surface areas of the terminal electrodes 60 and 70. As a result, it is possible to increase the fixing strength of the capacitor 100 with respect to the circuit board 200. It is to be noted that the fixing strength is 0.8 N in the case of forming no protective film 80, whereas the fixing strength is 1.0 N according to the present embodiment. The fixing strength refers to stress applied to the capacitor 100 or the circuit board 200 when the capacitor 100 is broken down by performing a board bending test, with the capacitor 100 mounted on the circuit board 200.

Further, according to the present embodiment, the capacitor 100 has the protective film 80, and thus the terminal electrodes 60 and 70 have irregularities (steps) formed. Thus, the solders can remain on parts of the terminal electrodes 60 and 70 other than the parts thereof formed on the protective film 80. As a result, the mounting inclination of the capacitor 100 with respect to the circuit board 200 can be reduced in mounting the capacitor 100. It is to be noted that the mounting inclination is about 13 degrees in the case of forming no protective film 80, whereas the mounting inclination is about 3 degrees according to the present embodiment.

FIGS. 4A to 4G are schematic diagrams illustrating an example of a method for manufacturing the capacitor 100 according to the present embodiment. The method for manufacturing the capacitor 100 will be described below with reference to FIGS. 4A to 4G. It is to be noted that with reference to FIGS. 4A to 4G, one capacitor 100 will be described, but a plurality of capacitors 100 can be formed for the same substrate 10 at the same time.

Figure 4A:
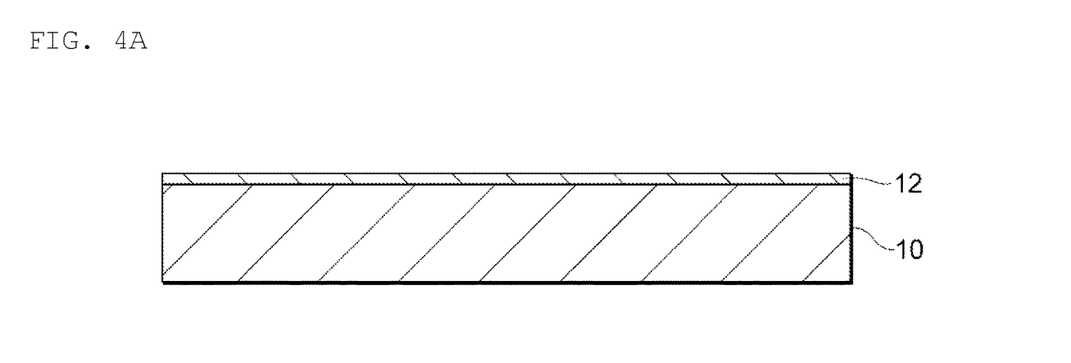
FIG. 4A is a schematic view illustrating an example of a method for manufacturing the capacitor 100.

As shown in FIG. 4A, first the substrate 10 is prepared, and the insulating film 12 is formed on the substrate 10. For example, the substrate 10 is a silicon substrate, and the insulating film 12 is a silicon oxide film obtained by oxidizing the surface of the silicon substrate. The thickness of the substrate 10 is, for example, 100 μm to 300 μm. When the thickness of the substrate 10 is adjusted to 100 μm to 300 μm, the capacitor 100 can be kept in a shape which is easily handled during the mounting, while maintaining the mechanical strength of the substrate 10. It is to be noted that the substrate 10 may be another semiconductor substrate such as gallium arsenide, or an insulating substrate such as glass or alumina. In addition, the insulating film 12 is, for example, approximately 0.1 μm to 3 μm in film thickness. However, the insulating film 12 may have any thickness as long as the insulation between the substrate 10 and the lower electrode 20 can be maintained. The insulating film 12 may be formed from an insulating material such as silicon nitride or aluminum oxide.

Figure 4B:
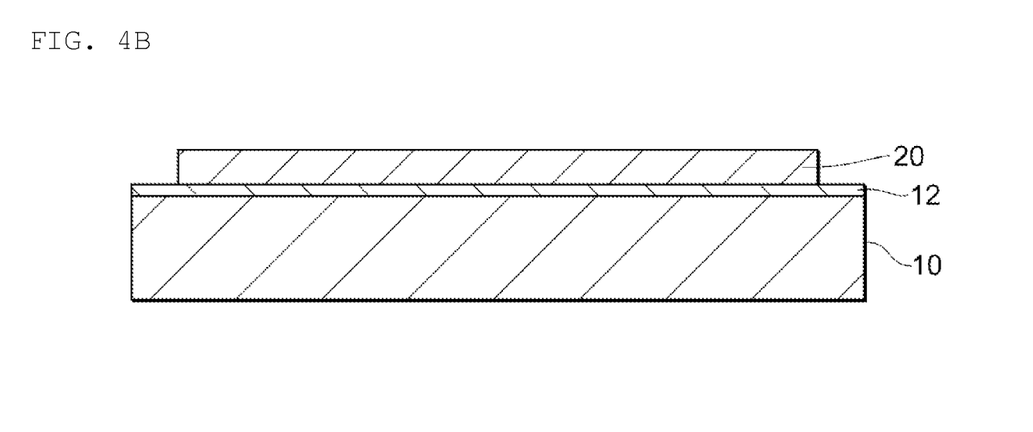
FIG. 4B is a schematic view illustrating an example of the method for manufacturing the capacitor 100.

Next, as shown in FIG. 4B, a metallic film made of a metallic material constituting the lower electrode 20 is formed on the insulating film 12, the metallic film is subjected to patterning with a photoresist, and with the photoresist as a mask, the metallic film is etched, thereby forming the lower electrode 20. The metallic material is, for example, copper, silver, gold, aluminum, or the like. In addition, the film thickness of the lower electrode 20 may be, for example, 0.5 μm to 10 μm, or may be 2 μm to 6 μm. When the film thickness of the lower electrode 20 is adjusted to 0.5 μm to 10 μm, the resistance value of the lower electrode 20 can be adjusted to such a value that has no influence on the high frequency characteristics of the capacitor 100, and the stress generated by the lower electrode 20 can be kept low to such an extent that the capacitor 100 is not distorted.

Figure 4C:
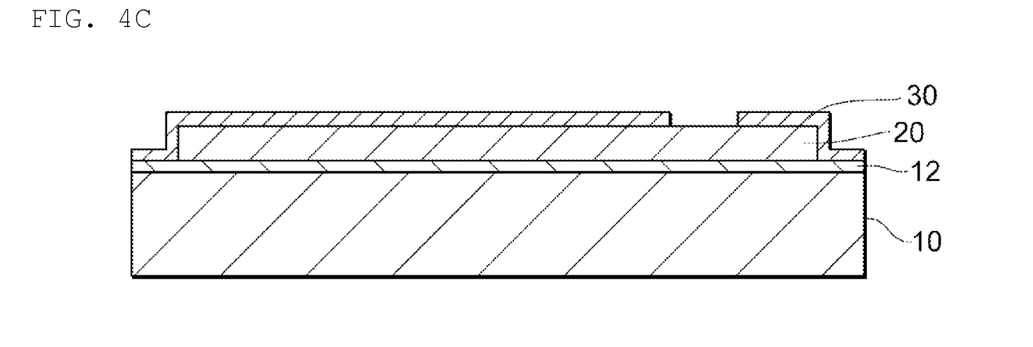
FIG. 4C is a schematic view illustrating an example of the method for manufacturing the capacitor 100.

Next, as shown in FIG. 4C, the dielectric film 30 is formed. First, a dielectric material that forms the dielectric film 30 is deposited on the upper surface and the end surface of the lower electrode 20, and on the insulating film 12. The dielectric material is, for example, a silicon nitride film, which is, for example, 0.1 μm to 1.5 μm in film thickness. Then, with a photoresist subjected to patterning as a mask, the dielectric material is partially removed so as to expose a part of the upper surface of the lower electrode 20, thereby form the opening 32. Thus, the dielectric film 30 is formed. The dielectric film 30 may be formed from a dielectric material made of another oxide or nitride such as silicon oxide, silicon nitride, aluminum oxide, hafnium oxide, tantalum oxide, or zirconium oxide. Further, the dielectric film 30 may be a multi-layer film composed of different dielectric materials.

Figure 4D:
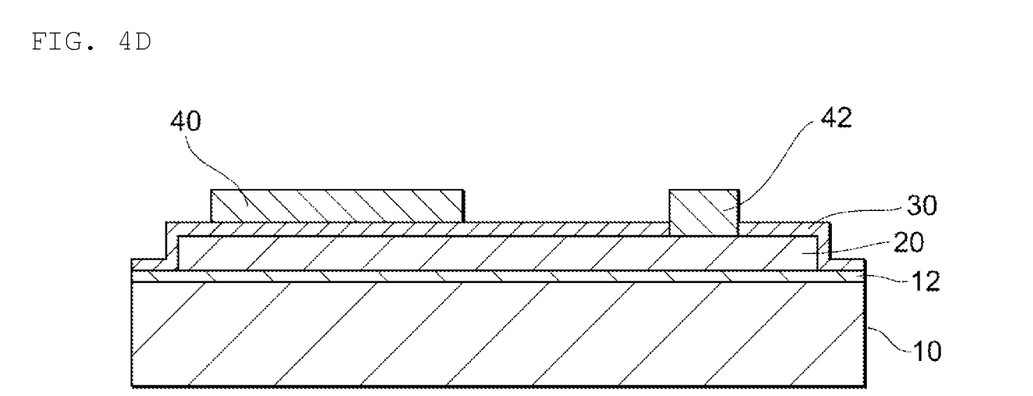
FIG. 4D is a schematic view illustrating an example of the method for manufacturing the capacitor 100.

Next, as shown in FIG. 4D, the upper electrode 40 and the via electrode 42 are formed. First, a metal material that forms the upper electrode 40 and the via electrode 42 is deposited on the dielectric film 30 and the insulating film 12, and in the opening 32 (see FIG. 4C) of the dielectric film 30. The upper electrode 40 and the via electrode 42 are, for example, 0.5 μm to 10 μm, or may be 2 μm to 6 μm in thickness. As just described, the upper electrode 40 has a relatively large film thickness, thereby making it possible to lower the series resistance. In addition, the metallic material is, for example, copper, silver, gold, aluminum, or the like. Then, with a photoresist subjected to patterning as a mask, the deposited metallic material is etched to form the upper electrode 40 for a partial region of the lower electrode 20, and the via electrode 42 in the opening 32 of the dielectric film 30.

It is to be noted that according to the present embodiment, the lower electrode 20 is formed to be larger in film thickness than the upper electrode 40. Thus, even when the upper electrode 40 is formed inside the lower electrode 20 in the plan view, the equivalent series resistance can be kept low.

Figure 4E:
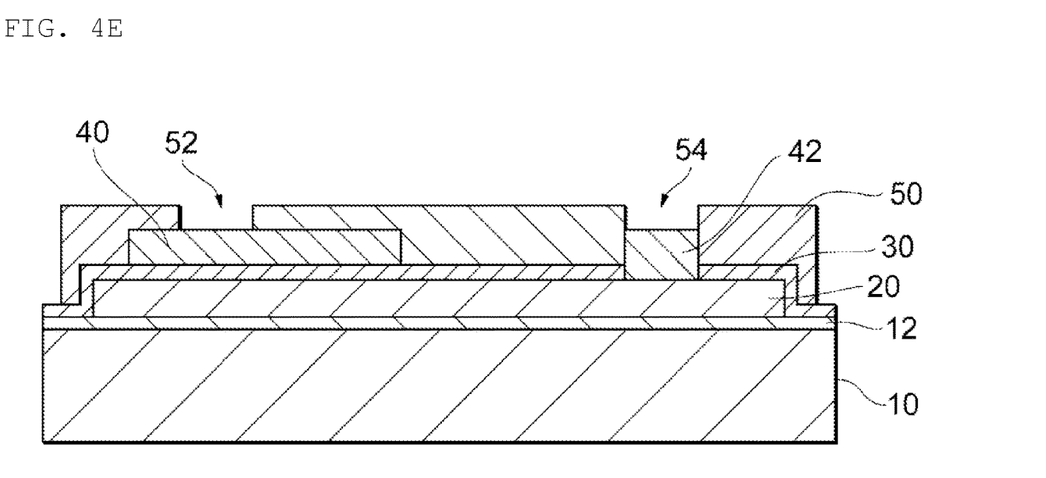
FIG. 4E is a schematic view illustrating an example of the method for manufacturing the capacitor 100.

Next, as shown in FIG. 4E, the insulating film 50 is formed. First, an insulating material that forms the insulating film 50 is deposited on the upper electrode 40, the via electrode 42, the dielectric film 30, and the insulating film 12. The insulating film 50 is formed from an insulating material such as a polyimide resin or a silicon oxide. The insulating film 50 is, for example, 1 µm or more and 20 µm or less in film thickness. Thus, the capacitance formed between the lower electrode 20 and the terminal electrode 60 with the insulating film 50 interposed therebetween can be made higher than the capacitance formed between the lower electrode 20 and the upper electrode 40 with the dielectric film 30 interposed therebetween. In addition, since it is not always necessary to use a high-viscosity material as a material that forms the insulating film 50, the thickness of the insulating film 50 can be controlled in a relatively easy way. As a result, the variation in the capacitance of the capacitor 100 can be reduced.

Then, with a photoresist subjected to patterning as a mask, the insulating material is etched to form the openings 52 and 54 respectively such that a part of the upper electrode 40 and a part of the via electrode 42 are exposed. It is to be noted that according to the present embodiment, the insulating film 50 is formed so as to cover the side wall part (side surface) of the lower electrode 20. Thus, even if the dielectric film 30 is not sufficiently formed on the side wall part of the lower electrode 20, the lower electrode 20 can be prevented from being exposed. As a result, the solder and the lower electrode 20 can be prevented from being short-circuited at the side wall part of the lower electrode 20 in mounting the capacitor 100.

Figure 4F:
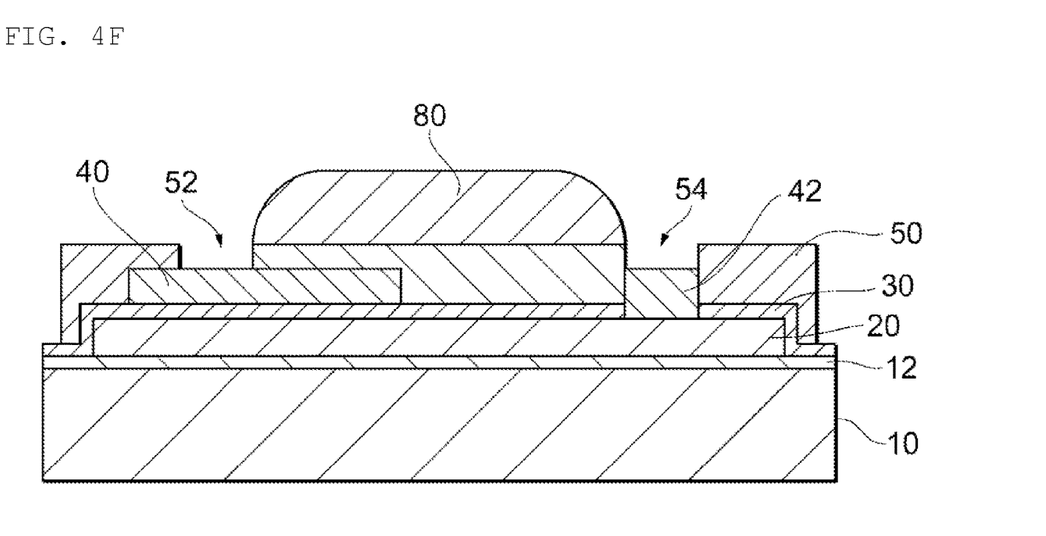
FIG. 4F is a schematic view illustrating an example of the method for manufacturing the capacitor 100.

Next, as shown in FIG. 4F, the protective film 80 is formed. First, a resin material (polyimide, benzocyclobutene, polybenzoxazole, organic passivation material, or the like) that forms the protective film 80 is applied onto the insulating film 50, the upper electrode 40, and the via electrode 42, and exposed and developed so as to provide a predetermined pattern in the plan view. Then, the resin material is cured to form the protective film 80.

Figure 4G:
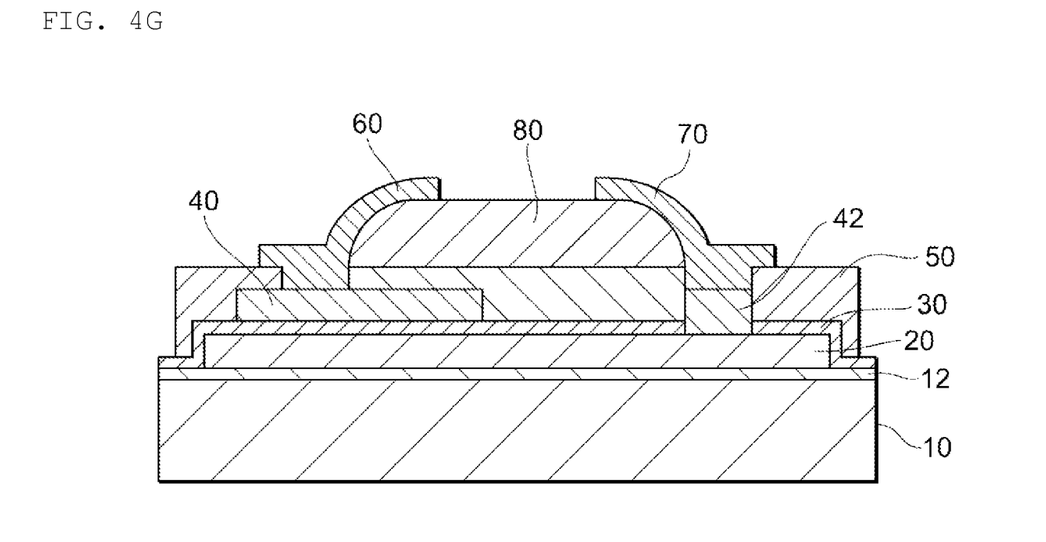
FIG. 4G is a schematic view illustrating an example of the method for manufacturing the capacitor 100.

Next, as shown in FIG. 4G, the terminal electrodes 60 and 70 are formed. First, a metallic material is deposited on the upper electrode 40, the via electrode 42, the insulating film 50, and the protective film 80 to form a seed layer. The seed layer is, for example, a laminate of copper and titanium. Then, a resist is applied onto the seed layer, and subjected to patterning so that the seed layer is exposed in the region where the terminal electrodes 60 and 70 are to be formed. Then, with the seed layer as an electrode, a metallic material is deposited by electrolytic plating on the exposed parts of the seed layer. According to the present embodiment, as the metal material, copper, nickel, and gold are respectively deposited to be 4 µm, of 4 µm, and 0.2 µm. Then, the resist is removed, and the seed layer is etched, thereby forming the terminal electrodes 60 and 70. Through the foregoing steps, the capacitor 100 according to the present embodiment can be obtained.

Figure 5:
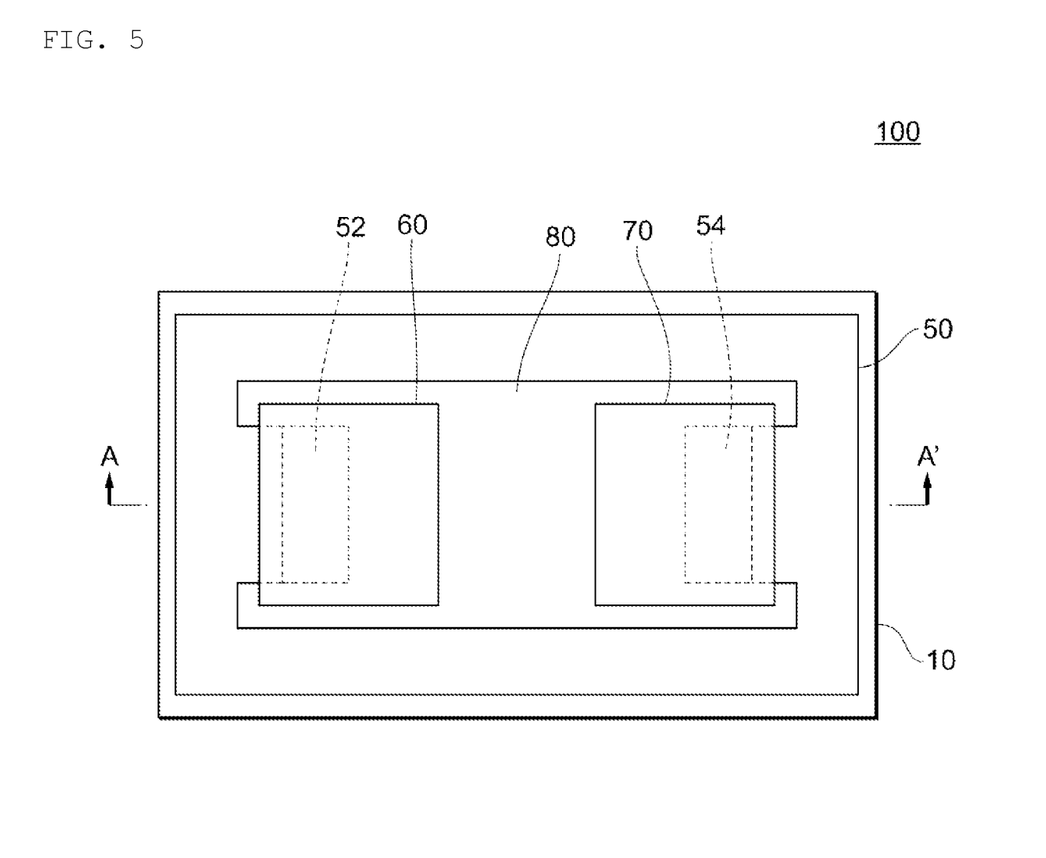
FIG. 5 is a diagram illustrating a second embodiment of the capacitor 100.
Figure 6:
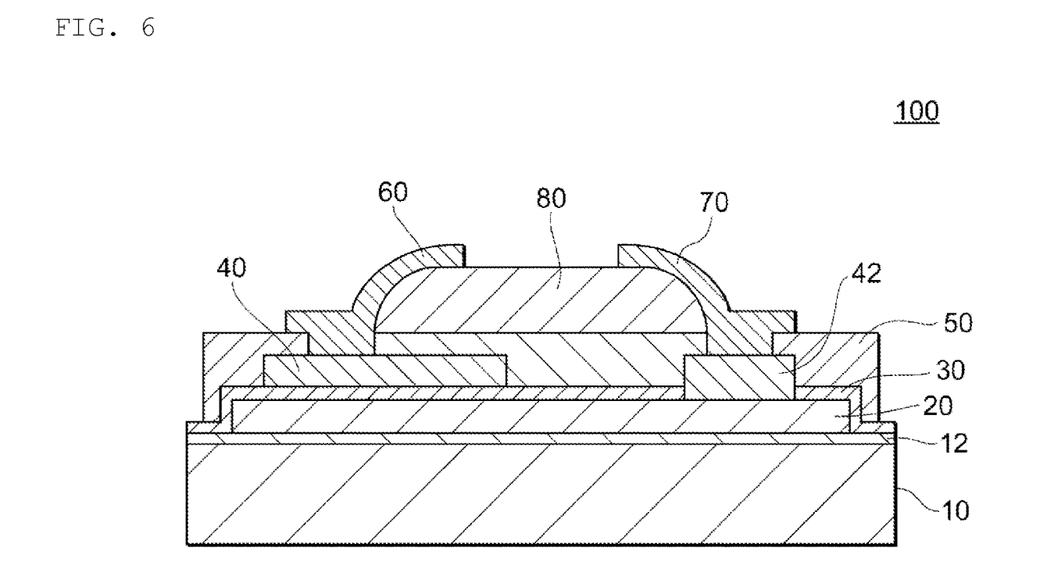
FIG. 6 is a diagram illustrating the second embodiment of the capacitor 100.

FIG. 5 is a plan view schematically illustrating the structure of a capacitor 100 according to a second embodiment of the present invention. In addition, FIG. 6 is a diagram illustrating a cross section taken along line AA' of FIG. 5. It is to be noted that FIGS. 5 and 6 illustrate extracted further exemplary configuration for at least partially explaining features of the structure of the capacitor 100, but the capacitor 100 is not limited by the exact structure shown in the figures. In addition, in the second embodiment and the subsequent sections, descriptions of common matters with the first embodiment will be omitted, and only differences will be described. Particularly, the similar functions and effects achieved by similar configurations will not be mentioned sequentially for each embodiment.

In the capacitor 100 according to the present embodiment, the protective film 80 is provided so as to cover the insulating film 50 around three sides for each of the openings 52 and 54 in the plan view. More specifically, the openings 52 and 54 have a rectangular shape with four sides, and the protective film 80 is provided so as to cover the insulating film 50, for each periphery of the openings 52 and 54, around the side opposed to the opening 54 or 52 and two sides adjacent to the side.

According to the present embodiment, the terminal electrodes 60 and 70 have larger regions with irregularities (steps) formed, and thus the stress applied to the capacitor 100 can be further dispersed. Further, since the area joined with solder 240 and 250 is further increased, the fixing strength can be further improved. It is to be noted that the fixing strength is 1.0 N according to the first embodiment, whereas the fixing strength is 1.5 N according to the present embodiment.

Figure 7:
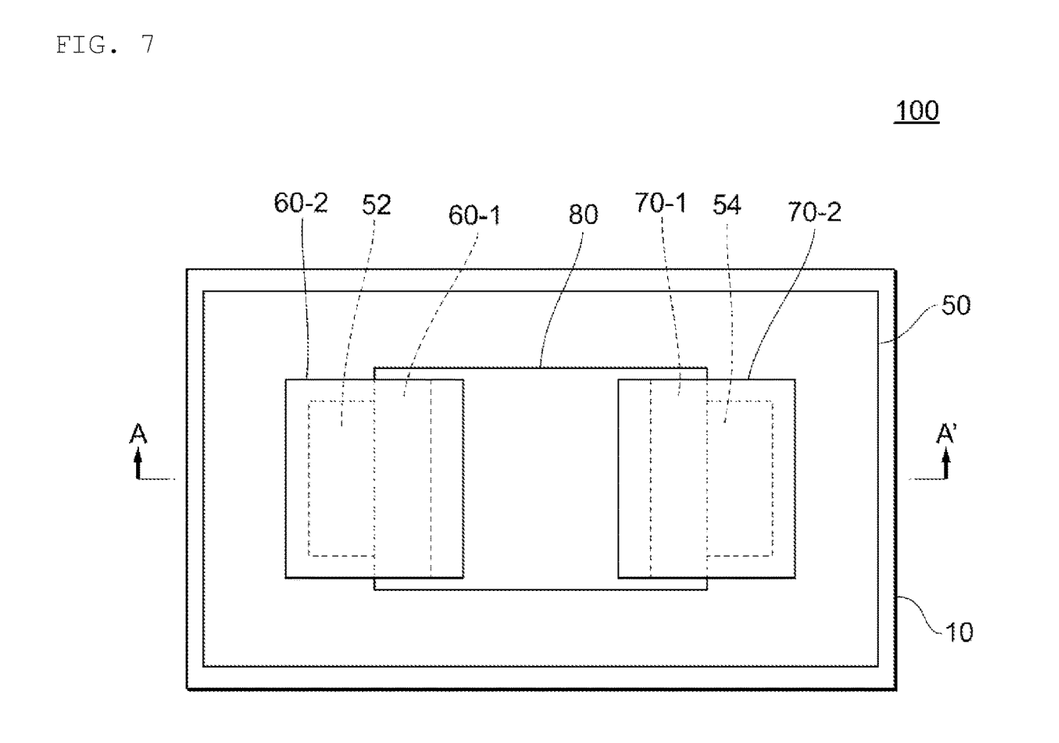
FIG. 7 is a diagram illustrating a third embodiment of the capacitor 100.
Figure 8:
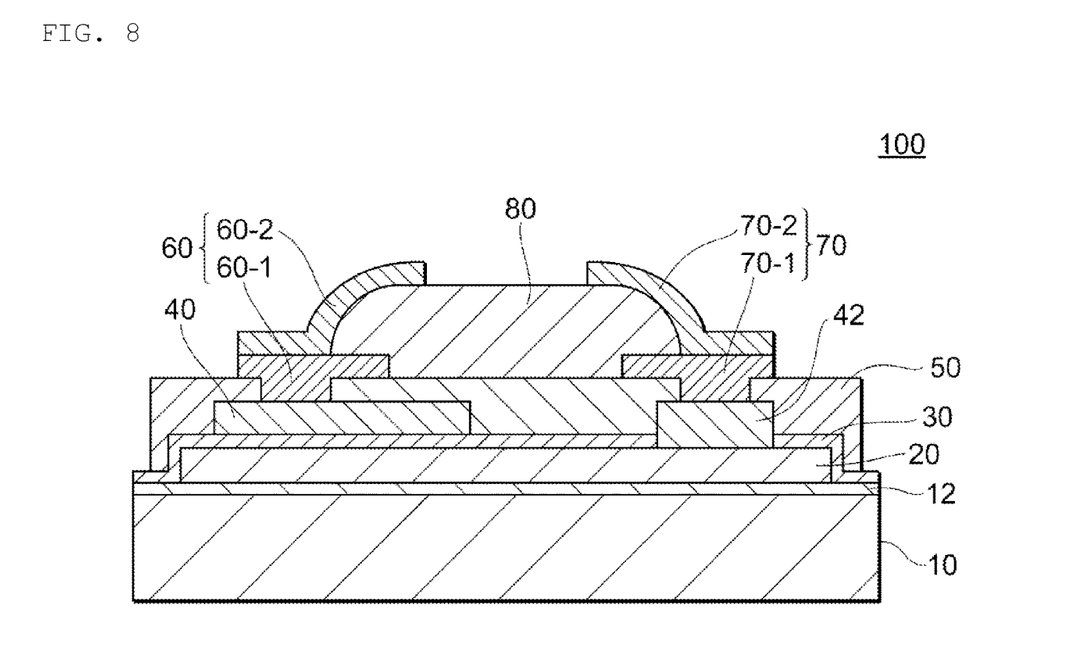
FIG. 8 is a diagram illustrating the third embodiment of the capacitor 100.

FIG. 7 is a plan view schematically illustrating the structure of a capacitor 100 according to a third embodiment of the present invention. In addition, FIG. 8 is a diagram illustrating a cross section taken along line AA' of FIG. 7. It is to be noted that FIGS. 7 and 8 illustrate yet a further exemplary configuration required for at least partially explaining features of the structure of the capacitor 100, but the capacitor 100 is not limited by the exact structure shown in the figures.

For the capacitor 100 according to the present embodiment, terminal electrodes 60 and 70 have a two-layer structure. Specifically, the terminal electrode 60 includes a first layer 60-1 formed from an upper electrode 40 to a part of an insulating film 50, and a second layer 60-2 formed from the first layer 60-1 to a protective film 80. Likewise, the terminal electrode 70 includes a first layer 70-1 formed from a via electrode 42 to a part of the insulating film 50, and a second layer 70-2 formed from the first layer 70-1 to the protective film 80. Further, the protective film 80 is formed on the insulating film 50 and the first layers 60-1 and 70-1 after the first layers 60-1 and 70-1 are formed.

The exemplary embodiments of the present invention have been described above.

The capacitor 100 according to an embodiment of the present invention includes the substrate 10 with the surface and the rear surface, the element provided on the surface of the substrate 10, the upper electrode 40 and/or the via electrode 42 electrically connected to the element, the insulating film 50 provided with the openings 52 and/or 54 at positions overlapped with the upper electrode 40 and/or the via electrode 42 in the plan view of the surface of the substrate 10, the protective film 80 provided so as to cover the insulating film 50 in a region including at least a part of the periphery of the openings 52 and/or 54, and the terminal electrodes 60 and/or 70 provided over from the upper electrode 40 and/or the via electrode 42 to the protective film 80.

Accordingly, the stress applied to the capacitor 100 in the thickness direction can be dispersed in the protective film 80, and the stress applied to the capacitive element and the substrate 10 can be thus reduced. Further, the protective film 80 has a sufficient thickness, and thus, even if relatively high stress is applied to the capacitor 100, cracks generated in the capacitor 100 can be stopped at the protective film 80, and kept from reaching the capacitive element or the substrate 10. Further, the capacitor 100 has the protective film 80, thereby making it possible to increase the surface areas of the terminal electrodes 60 and 70. As a result, it is possible to increase the fixing strength of the capacitor 100 with respect to the circuit board 200. Furthermore, the capacitor 100 has the protective film 80, and thus the terminal electrodes 60 and 70 have irregularities (steps) formed. Thus, the solders can remain on parts of the terminal electrodes 60 and 70 other than the parts thereof formed on the protective film 80. As a result, the mounting inclination of the capacitor 100 with respect to the circuit board 200 can be reduced in mounting the capacitor 100.

In addition, the openings 52 and/or 54 have a rectangular shape including four sides in the plan view, and the protective film 80 may be provided so as to cover the insulating film 50 around three sides of the four sides of the openings 52 and/or 54. Accordingly, the terminal electrodes 60 and 70 have larger regions with irregularities (steps) formed, the stress applied to the capacitor 100 can be thus further dispersed. Further, since the area joined with solder 240 and 250 is further increased, the fixing strength can be further improved.

It is to be noted that the respective embodiments described above are intended to facilitate understanding of the present invention, but not intended to limit the present invention in any way. Modifications and/or improvements can be made to the present invention without departing from the spirit of the present invention, and the present invention encompasses equivalents thereof. More specifically, the scope of the present invention also encompasses therein the respective embodiments with design changes appropriately made thereto by one skilled in the art, as long as the embodiments have the features of the present invention. For example, the respective elements included in the respective embodiments, and the layout, materials, conditions, shapes, sizes, and the like of the elements are not to be considered limited to those exemplified, but can be changed appropriately. Furthermore, obviously, the following respective embodiments are considered by way of example, and it is possible to partially substitute or combine configurations presented in the different embodiments, and the scope of the present invention encompasses therein the foregoing substitutions and combinations, as long as the substitutions and the combinations include the features of the present invention.

DESCRIPTION OF REFERENCE SYMBOLS

10: substrate
12: insulating film
20: lower electrode
30: dielectric film
40: upper electrode
42: via electrode
50: insulating film
52: opening
54: opening
60: terminal electrode
70: terminal electrode
80: protective film
100: capacitor
200: circuit board

The invention claimed is:

1. An electronic component comprising: a substrate having a first main surface and a second main surface; an element on the first main surface of the substrate; a first contact electrode electrically connected to the element; an insulating film defining a first opening of a position that has an overlap with the first contact electrode in a plan view of the first main surface; a protective film covering the insulating film in a region including at least a part of a periphery of the first opening; and a first external electrode electrically connected to the first contact electrode and extending over the protective film, the first external electrode including a single step portion in a cross sectional view thereof between a first end of the external electrode proximal to a center of electronic component and a second end of the external electrode distal from the center of the electronic component such that the first end and the second end of the external electrode are in different planes perpendicular to the cross-sectional view when viewed in the cross-sectional view.

2. The electronic component according to claim 1, wherein the first opening has a rectangular shape including four sides in the plan view of the first main surface.

3. The electronic component according to claim 2, wherein the protective film covers the insulating film around three of the four sides of the first opening.

4. The electronic component according to claim 1, wherein the first external electrode has a two-layer structure that includes a first layer extending from the first contact electrode to a surface of the insulating film, and a second layer extending from the first layer to over the protective film.

5. The electronic component according to claim 4, wherein
the protective film has a contact surface in contact with the insulating film, and an opposed surface opposed to the contact surface, and
the second layer of the first external electrode extends over the opposed surface.

6. The electronic component according to claim 5, wherein a portion of the opposed surface over which the second layer of the first external electrode extends has an arcuate cross section.

7. The electronic component according to claim 1, wherein
the protective film has a contact surface in contact with the insulating film, and an opposed surface opposed to the contact surface, and
the first external electrode extends from the first contact electrode over the opposed surface.

8. The electronic component according to claim 7, wherein a portion of the opposed surface over which the first external electrode extends has an arcuate cross section.

9. The electronic component according to claim 1, further comprising a second contact electrode electrically connected to the element, wherein
the insulating film defines a second opening at a position that has an overlap with the second contact electrode,
the region covered by the protective film extends between the first opening and the second opening and includes the at least the part of the periphery of the first opening and at least a part of a periphery of the second opening, and
the electronic component further comprises a second external electrode electrically connected to the second contact electrode and extending over the protective film.

10. The electronic component according to claim 9, wherein
the protective film has a contact surface in contact with the insulating film, and an opposed surface opposed to the contact surface, the first external electrode extends from the first contact electrode over the opposed surface, and the second external electrode extends from the first contact electrode over the opposed surface.

11. The electronic component according to claim 10, wherein a first portion of the opposed surface over which the first external electrode extends has an arcuate cross section, and a second portion of the opposed surface over which the second external electrode extends has an arcuate cross section.

12. The electronic component according to claim 9, wherein the first opening has a rectangular shape including four sides in the plan view of the first main surface, and the second opening has a rectangular shape including four sides in the plan view of the first main surface.

13. The electronic component according to claim 12, wherein the protective film covers the insulating film around three of the four sides of the first opening, and the protective film covers the insulating film around three of the four sides of the second opening.

14. The electronic component according to claim 9, wherein the first external electrode has a two-layer structure that includes a first layer extending from the first contact electrode to a surface of the insulating film, and a second layer extending from the first layer to over the protective film, and the second external electrode has a two-layer structure that includes a first layer extending from the second contact electrode to a surface of the insulating film, and a second layer extending from the first layer to over the protective film.

15. The electronic component according to claim 14, wherein the protective film has a contact surface in contact with the insulating film, and an opposed surface opposed to the contact surface, the second layer of the first external electrode extends over the opposed surface, and the second layer of the second external electrode extends over the opposed surface.

16. The electronic component according to claim 15, wherein a first portion of the opposed surface over which the second layer of the first external electrode extends has an arcuate cross section, and a second portion of the opposed surface over which the second layer of the second external electrode extends has an arcuate cross section.

17. The electronic component according to claim 1, wherein the protective film is thicker than the insulating film.

18. The electronic component according to claim 17, wherein a material of the protective film has a lower elastic modulus than a material of the insulating film.

19. The electronic component according to claim 1, wherein a material of the protective film has a lower elastic modulus than a material of the insulating film.

20. The electronic component according to claim 1, wherein the element is a capacitor having a lower electrode, an upper electrode, and a dielectric film between the lower electrode and the upper electrode, and wherein the contact electrode is electrically connected to the lower electrode.

* * * * *